US011211282B2

(12) United States Patent
Chang et al.

(10) Patent No.: US 11,211,282 B2
(45) Date of Patent: Dec. 28, 2021

(54) APPARATUS TO REDUCE CONTAMINATION IN A PLASMA ETCHING CHAMBER

(71) Applicant: APPLIED MATERIALS, INC., Santa Clara, CA (US)

(72) Inventors: Xue Chang, San Jose, CA (US); Andrew Nguyen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 596 days.

(21) Appl. No.: 16/010,239

(22) Filed: Jun. 15, 2018

(65) Prior Publication Data

US 2019/0385891 A1  Dec. 19, 2019

(51) Int. Cl.
| | |
|---|---|
| *H01L 21/687* | (2006.01) |
| *C23C 16/458* | (2006.01) |
| *H01J 37/32* | (2006.01) |
| *C23C 14/50* | (2006.01) |

(52) U.S. Cl.
CPC .... *H01L 21/68785* (2013.01); *C23C 16/4585* (2013.01); *H01J 37/32715* (2013.01); *H01L 21/68735* (2013.01); *H01L 21/68757* (2013.01); *C23C 14/50* (2013.01); *H01J 37/32642* (2013.01); *H01J 2237/334* (2013.01)

(58) Field of Classification Search
CPC ... C23C 16/4585; C23C 14/564; C23C 14/50; C23C 14/34; H01L 21/68735; H01L 21/68785; H01L 21/68757; H01L 21/67069; H01L 21/6833; H01L 21/683; H01J 37/32642; H01J 2237/334; H01J 37/32715; H01J 37/32477
USPC .......................................................... 118/728
See application file for complete search history.

(56) References Cited

U.S. PATENT DOCUMENTS

| | | | |
|---|---|---|---|
| 5,983,906 A | 11/1999 | Zhao et al. | |
| 6,051,286 A | 4/2000 | Zhao et al. | |
| 8,270,141 B2 | 9/2012 | Willwerth et al. | |
| 9,315,891 B2* | 4/2016 | Lee | C23C 14/34 |
| 2005/0133164 A1* | 6/2005 | Fischer | H01L 21/68735 |
| | | | 156/345.51 |
| 2007/0283884 A1* | 12/2007 | Tiller | C23C 14/564 |
| | | | 118/715 |
| 2014/0273483 A1* | 9/2014 | Ge | H01J 37/32651 |
| | | | 438/710 |
| 2020/0255968 A1* | 8/2020 | Mukaiyama et al. | |
| | | | H01L 21/68735 |
| | | | 156/345.51 |

* cited by examiner

Primary Examiner — Mahdi H Nejad
(74) Attorney, Agent, or Firm — Moser Taboada

(57) ABSTRACT

Embodiments of process kit components for use in a substrate support, and substrate supports incorporating same, are provided herein. In some embodiments, the substrate support may include a body, a grounding shell formed of an electrically conductive material disposed about the body, a liner formed of an electrically conductive material disposed about the grounding shell, where the liner includes an upper lip that extends inwardly towards the body, a metal fastener disposed through the upper lip to couple the liner to the grounding shell, and a first insulator ring disposed atop the upper lip of the liner and covering the metal fastener.

16 Claims, 3 Drawing Sheets

APPARATUS TO REDUCE CONTAMINATION IN A PLASMA ETCHING CHAMBER

FIELD

Embodiments of the present disclosure generally relate to substrate processing equipment, and more specifically to substrate supports used in substrate processing equipment.

BACKGROUND

Metal fasteners are often used to connect various structures that make up a substrate support within a processing chamber, such as a plasma processing chamber. The inventors have discovered that metal fasteners, such as titanium (Ti) screws, near conductive structures of a substrate support can cause Ti contamination within a processing chamber.

Accordingly, the inventors have provided an improved substrate support that can reduce or eliminate metal contamination from metal fasteners.

SUMMARY

Embodiments of process kit components for use in a substrate support, and substrate supports incorporating same, are provided herein. In some embodiments, a substrate support includes: a body; a grounding shell formed of an electrically conductive material disposed about the body; and a liner formed of an electrically conductive material disposed about the grounding shell. The liner includes an upper lip that extends inwardly towards the body. A metal fastener is disposed through the upper lip to couple the liner to the grounding shell. A first insulator ring is disposed atop the upper lip of the liner and covers the metal fastener.

In some embodiments, a substrate support includes: a body; a shaft extending downward from the body; a conductive liner disposed about the body, wherein the conductive liner has an upper lip extending inwardly that overlays an upper surface of a grounding shell; a fastener disposed through the upper lip to couple the conductive liner to the grounding shell; a first insulator ring disposed atop the upper lip of the liner and covering the metal fastener; and a second insulator ring circumscribing the body, wherein the second insulator ring is disposed in a notched upper inside peripheral edge of the first insulator ring.

In some embodiments, a substrate support includes: a body having a cylindrical shape and a notched upper peripheral edge defined by a first surface perpendicular to a sidewall of the body; a conductive shell having a top surface disposed about the body; a conductive liner disposed about the conductive shell and having an inner lip that extends over the conductive shell; a plurality of fasteners disposed through the conductive liner to couple the conductive liner to the conductive shell; a first insulator ring disposed on a top surface of the conductive liner and covering the plurality of fasteners; and a second insulator ring disposed between the first insulator ring and the body, wherein the second insulator ring is partially disposed within the notched upper peripheral edge of the body and extends outwardly toward the conductive liner.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate only some embodiments of the disclosure and are therefore not to be considered limiting of scope, for the disclosure may admit to other equally effective embodiments.

Figure 1:
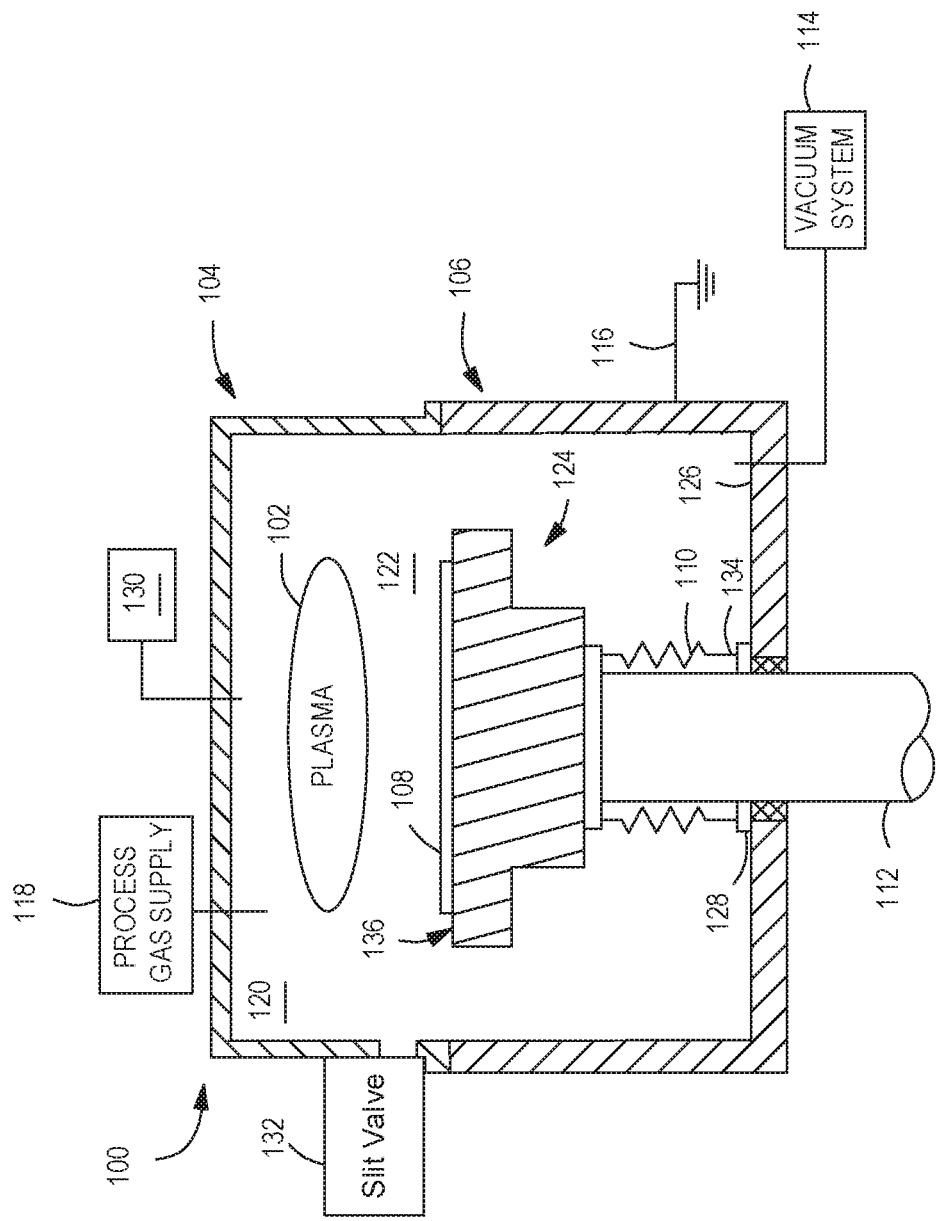
FIG. 1 depicts a schematic cross sectional view of a plasma processing chamber for use with a substrate support in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Figure 2:
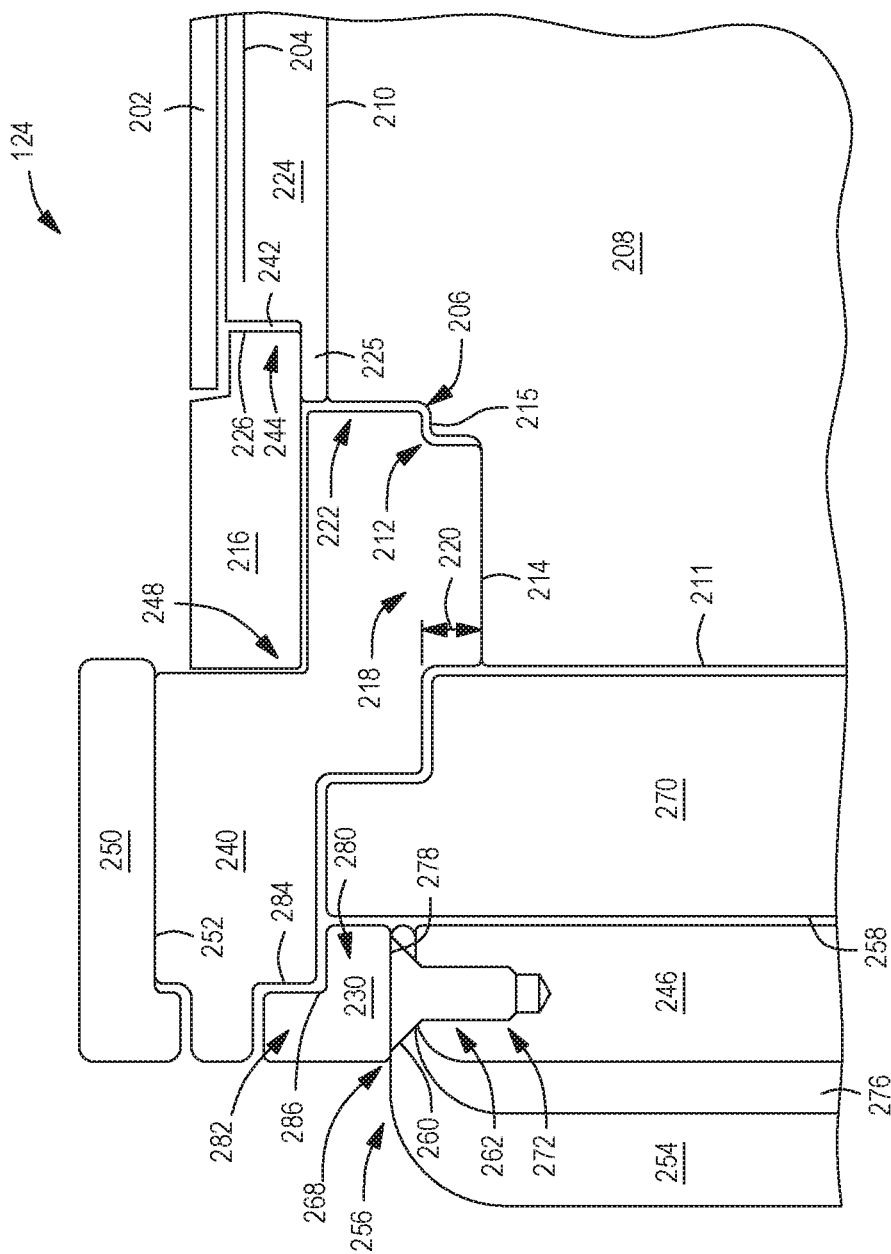
FIG. 2 depicts a partial schematic side view of the substrate support of FIG. 1 in accordance with some embodiments of the present disclosure.
Figure 3:
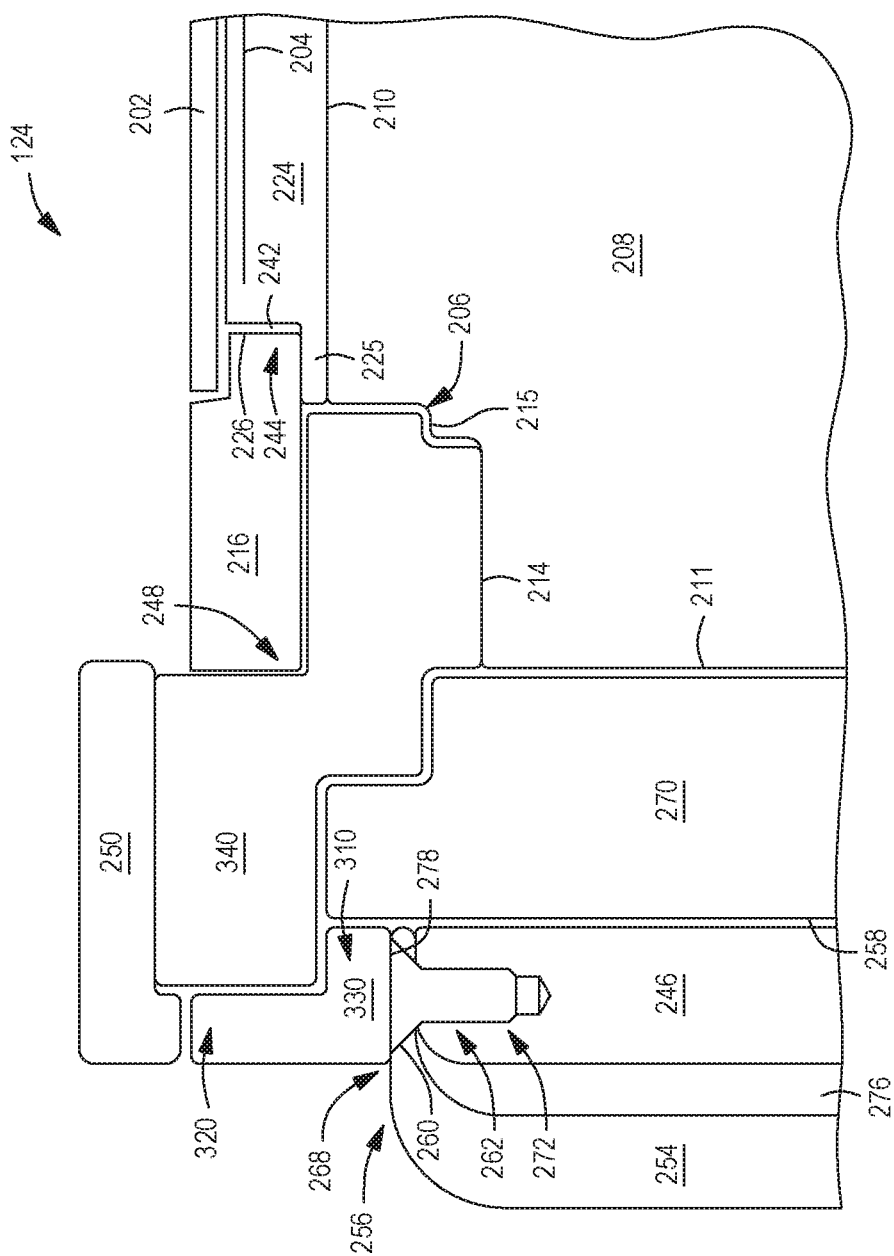
FIG. 3 depicts a partial schematic side view of the substrate support of FIG. 1 in accordance with some embodiments of the present disclosure.

Embodiments of process kit components for a substrate support that may advantageously reduce or prevent metal contamination within a process chamber, such as titanium (Ti) contamination, are provided herein. Specifically, embodiments of the substrate support may include an insulator ring configured to overlay one or more metal fasteners, thus preventing plasma within a processing chamber from contacting the one or more metal fasteners. FIG. 1 depicts a schematic cross sectional view of a plasma processing chamber for use with a substrate support in accordance with some embodiments of the present disclosure. FIG. 2 depicts a partial detailed schematic side view in accordance with some embodiments of the substrate support of FIG. 1. FIG. 3 depicts a partial detailed schematic side view in accordance with some embodiments of the substrate support of FIG. 1.

FIG. 1 is a schematic cross-sectional view of a chamber 100, such as a plasma processing chamber, in accordance with some embodiments of the present disclosure. In some embodiments, the plasma processing chamber is an Etch processing chamber. However, other types of processing chambers can also use or be modified for use with embodiments of the substrate support described herein. The Etch processing chamber and substrate support described herein may operate for example, at temperatures of about 50° Celsius to about 500° Celsius, and at power levels between about 500 W to about 10 kW of power at frequencies of about 13 MHz to about 60 MHz.

The chamber 100 is a vacuum chamber which is suitably adapted to maintain sub-atmospheric pressures within a chamber interior volume 120 during high temperature or high power substrate processing. The chamber 100 includes a chamber body 106 covered by a lid 104 which encloses a processing volume 122 located in the upper half of the chamber interior volume 120. The chamber body 106 and lid 104 may be made of metal, such as aluminum. The chamber body 106 may be grounded via a coupling to ground 116. The lid 104 can be electrically floated or grounded.

A substrate support 124 is disposed within the chamber interior volume 120 to support and retain a substrate 108, such as a semiconductor substrate, for example, or other such substrate as may be electrostatically retained. The substrate support 124 may generally comprise a pedestal 136 and a hollow support shaft 112 for supporting the pedestal 136. The hollow support shaft 112 provides a conduit to provide, for example, process gases, fluids, coolants, power, or the like, to the pedestal 136.

In some embodiments, a bellows assembly 110 is disposed about the hollow support shaft 112 and is coupled between the pedestal 136 and a bottom surface 126 of chamber 100 to provide a flexible seal that allows vertical motion of the pedestal 136 while preventing loss of vacuum from within the chamber 100. The bellows assembly 110 also includes bellows 134 in contact with an o-ring 128 or other suitable sealing element which contacts bottom surface 126 to help prevent loss of chamber vacuum.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, the substrate 108 may enter the chamber 100 via an opening in the chamber body 106. The opening may be selectively sealed via a slit valve 132, or other apparatus for selectively providing access to the interior of the chamber 100 through the opening. Further, in operation, a plasma 102 may be created in the chamber interior volume 120 to perform one or more processes. The plasma 102 may be created by coupling power from a plasma power source (e.g., RF plasma power supply 130) to a process gas via one or more electrodes proximate to or within the chamber interior volume 120 to ignite the process gas and creating the plasma 102.

FIG. 2 depicts a partial detailed schematic side view in accordance with some embodiments of the substrate support of FIG. 1. The substrate support 124 includes a body 208 having an upper surface 210 to support a dielectric member 224 configured to electrostatically retain a substrate 202 disposed thereon.

The body 208 may comprise an electrically conductive material, such as aluminum (Al), or the like. The body 208 has an upper peripheral edge 206 that is stepped, or notched. The upper peripheral edge 206 of the body 208 is defined by a first surface 214 perpendicular to a sidewall 211 of the body 208 and a stepped second surface 215 disposed between the first surface 214 and the upper surface 210 of the body 208.

The body 208 may include one or more heat transfer fluid conduits (not shown) disposed near a lower surface of the body 208. The heat transfer fluid conduits may be coupled to a heat transfer fluid source (not shown) to supply heat transfer fluid to all adjoining conduits. The heat transfer fluid may be flowed through the conduits to control the temperature and/or temperature profile of the substrate support 124 during use.

In some embodiments, the dielectric member 224 is utilized to retain a substrate 202 via a DC voltage supplied to an electrode 204 by a DC power supply (not shown). Examples of suitable processing apparatus that may advantageously benefit from modification in accordance with embodiments of the present disclosure include processing apparatus such as plasma reactors including but not limited to any of the PRODUCER® line of processing equipment available from Applied Materials, Inc. of Santa Clara, Calif. The above listing of processing equipment is illustrative only, and other plasma reactors, and non-plasma equipment (such as CVD reactors, or other Etch processing equipment) may also be suitably modified in accordance with the present teachings.

The dielectric member 224 may further comprise a lip 225 extending radially about the dielectric member 224 from a bottom portion of the dielectric member 224 (e.g., adjacent to the upper surface 209 of the body 208). The lip 225 may extend to the peripheral edge of the upper surface 210 of the body 208 (e.g., to the radially inner edge of the upper peripheral edge 206 of the body 208). A bonding layer (not shown) may be disposed between the upper surface 210 of the body 208 and a lower surface of the dielectric member 224 to bond the body 208 to the dielectric member 224. When a bonding layer is used, the bonding layer may not extend fully to the peripheral edge of the upper surface 210 of the body 208. Accordingly, a portion of the lip 225 may be suspended in space instead of supported by the bonding layer.

Additional components of the substrate support 124 may include an insulator shell 270 circumscribing the body 208. The insulator shell 270 may be fabricated from at least one of ceramic, quartz, silicon, silicon carbide, or the like. The insulator shell 270 electrically insulates the body 208 from a grounding shell 246. The grounding shell 246 circumscribes the insulator shell 270. A liner 254 may circumscribe the grounding shell 246. A gap 276 may exist between the liner 254 and the grounding shell 246. The liner 254 is fabricated from a conductive material. The liner 245 includes a lip 256 that extends inwardly toward a central axis of the substrate support 124. In some embodiments, the lip 256 rests on a top surface 274 of the grounding shell 246. In some embodiments, the lip 256 extends inwardly to abut an outer sidewall 258 of the insulator shell 270.

The lip 256 includes one or more holes 260 disposed through the lip. Each hole 260 disposed along lip 256 may be any suitable shape to accommodate a respective fastener 262 disposed therethrough. For example, as illustrated in FIG. 2, the hole 260 may include a counterbore to allow the head of each fastener 262 (e.g., when the fastener is a bolt, screw, or the like) to be recessed below an upper surface 268 of the lip 256. The grounding shell 246 includes one or more openings 272 that correspond with the holes 260. Each opening 272 may be any suitable shape to accommodate a respective fastener 262 disposed within the opening 272. In some embodiments, the openings 272 may be threaded to mate with corresponding threads of the fastener 262.

The fastener 262 is disposed through the hole 260 to couple the liner 254 to the grounding shell 246 via the opening 272. Each fastener may be a screw, bolt, clamp, or the like. In some embodiments, the fastener is a screw. Each fastener may comprise a metal, such as titanium (Ti), steel alloy, or the like. In some embodiments, the fastener comprises titanium (Ti). In some embodiments, a washer (not shown) may be disposed about each fastener 262. The washer may comprise the same material as the fastener 262. In some embodiments, the washer is titanium (Ti).

The substrate support 124 further includes a first insulator ring 230 disposed about the body 208 and on top of the lip 256 of the liner 254. The first insulator ring 230 is sized to cover the one or more holes 260. A bottom surface 278 of the first insulator ring 230 forms a seal with the upper surface 268 of the liner 254, over the fastener 262. In use, the seal provided by the first insulator ring 230 advantageously limits or prevents the fastener 262 from being exposed to plasma 102 in the chamber 100. In some embodiments, the first insulator ring 230 circumscribes the insulator shell 270.

The first insulator ring 230 may comprise quartz, aluminum oxide, an anodized metal, such as anodized aluminum, aluminum coated with yttrium oxide, or the like.

The substrate support 124 further includes a second insulator ring 240 disposed about the body 208. The second insulator ring 240 is disposed in the notched upper peripheral edge 206 of the body 208. In some embodiments, the second insulator ring 240 may be fabricated from quartz or the like. The second insulator ring 240 includes a stepped inner sidewall 212 that mates with the stepped second surface 215 of the upper peripheral edge 206 to define a non-linear interface therebetween. The non-linear interface adds a torturous path for the plasma and breaks the line of sight from the plasma to any fasteners disposed through the body 208 beneath the second insulator ring 240.

The stepped inner sidewall 212 of the second insulator ring 240 may further comprise a first portion 218 extending downward from the second insulator ring 240 towards the first surface 214 of the upper peripheral edge 206 of the body 208. The first portion 218 may have a length 220 of between about 0.02 inch to 1.00 inches. The stepped inner sidewall 212 may further include a second portion 222 extending laterally from the second insulator ring 240 along the stepped second surface 215 of the upper peripheral edge 206 of the body 208. The second portion 222 may have a length of between about 0.02 inch to 1.00 inches.

The second insulator ring 240 may include a ledge 248 disposed about an upper inner edge of the second insulator ring 240. A top surface of the ledge 248 may be disposed even with or above the lip 225 of the dielectric member 224. An insert ring 216 may be disposed on the ledge 248 of the second insulator ring 240. The insert ring 216 may be fabricated from silicon (Si) or the like. An inner portion 226 of the insert ring 216 may extend inwardly toward a central axis of the substrate support 124 and rest atop the lip 225 of the dielectric member 224. A gap 242 may exist between the inner portion 226 of the insert ring 216 and the dielectric member 224.

The insert ring 216 may further comprise a ledge 244 disposed about an upper inner edge of the insert ring 216. A peripheral edge of the substrate 108 may extend into the ledge 244 of the insert ring 216. However, ledge 244 is typically configured such that the substrate 108 does not come into contact with the insert ring 216 and is completely supported by the dielectric member 224.

Optionally, a top ring 250 is disposed atop a top surface 252 of the second insulator ring 240. The top ring can include a downward protrusion along the lower outer edge of the top ring 250, as depicted in FIG. 2. The top ring 250 may be fabricated from silicon (Si) or the like. The top ring 250 may protect the first insulator ring 230 from degradation or damage from the plasma and/or from the process environment.

The first insulator ring 230 may include a first portion 280 and a second portion 282. In some embodiments, the first insulator ring 230 has an L-shaped cross section. The first portion 280 is disposed between the lip 256 of the liner 254 and the second insulator ring 240. The first portion 280 has an inner diameter greater than an outer diameter of the insulator shell 270, such that the first insulator ring 230 can be disposed around an upper portion of the insulator shell 270. The first insulator ring 230 includes a notched upper inside peripheral edge 286. The second insulator ring 240 is disposed in the notched upper inside peripheral edge 286 of the first insulator ring 230 to form a non-linear interface therebetween. The non-linear interface adds a torturous path for the plasma similar as described above. The second portion 282 circumscribes a portion of the second insulator ring 240. For example, the second portion 282 of the first insulator ring 230 can be disposed in a notched lower outer peripheral edge 284 of the second insulator ring 240. In some embodiments, as shown in FIG. 2, the first insulator ring 230 has an outer diameter similar to (e.g., substantially the same as) an outer diameter of the second insulator ring 240. In some embodiments, the first insulator ring 230 has an outer diameter similar to (e.g., substantially the same as) an outer diameter of the second insulator ring 240 such that, when the first insulator ring 230 is disposed in the notched lower outer peripheral edge 284 of the second insulator ring 240, the outermost sidewall of the first insulator ring 230 and the outermost sidewall of the second insulator ring 240 are substantially vertically aligned (e.g., lie substantially along a common imaginary cylinder).

FIG. 3 depicts a partial detailed schematic side view of the substrate support of FIG. 1 in accordance with some embodiments of the present disclosure. Embodiments consistent with FIG. 3 can be identical to the above discussion with respect to FIGS. 1 and 2 unless explicitly disclosed to the contrary in the following discussion. In some embodiments, the first insulator ring 330 has an L-shaped cross section. In some embodiments, as shown in FIG. 3, a first insulator ring 330 has an outer diameter that is greater than an outer diameter of a second insulator ring 340. The first insulator ring 330 includes a first portion 310 (e.g., an annular base) and a second portion 320 (e.g., a lip extending vertically upward from the annular base). The first portion 310 is disposed between the second insulator ring 340 and the lip 256 of the liner 254. Thus, an inner diameter of the first portion 310 is less than the outer diameter of the second insulator ring 340, such that a radially outer portion of the second insulator ring 340 overlaps a radially inner portion of the first portion 310, as depicted in FIG. 3.

The second portion 320 circumscribes the second insulator ring 340. Thus, an inner diameter of the second portion 320 is greater than the outer diameter of the second insulator ring 340, such that a radially outer portion of the second insulator ring 340 is disposed radially inward of a radially inner portion of the second portion 320, as depicted in FIG. 3.

In some embodiments, the second portion 320 extends to proximate the top ring 250. In some embodiments, the second portion 320 extends to proximate the top ring 250 but does not contact the top ring 250, thus defining a small gap between the upper surface of the second portion 320 and the bottom surface of the top ring 250.

In some embodiments, and as depicted in FIGS. 2 and 3, the first insulator ring 230 does not contact the second insulator ring 240 and a narrow gap is defined between opposing surfaces of the first insulator ring 230 and the second insulator ring 240. In some embodiments, and as depicted in FIGS. 2 and 3, the first insulator ring 230 contacts only the lip 256 of the liner 254, and optionally, an upper portion of fasteners 262 disposed through the lip 256, if not countersunk.

The configurations of the first insulator ring 230 and the second insulator ring 240 in FIGS. 2 and 3 advantageously provide the same top-down process view as embodiments that do not include the first insulator ring 230, thus maintaining process integrity when changing existing process kits to accommodate the first insulator ring 230 and the second insulator ring 240. In other words, from a top-down view within the process chamber, the first insulator ring 230 is hidden from view, and the plasma advantageously does not "see" the first insulator ring 230. Hence, contamination in the chamber can be reduced without any or with minimal impact to on-substrate process results. In embodiments consistent with FIG. 2, the first insulator ring 230 is further advantageously hidden from view during processes that do not include the top ring 250, thus providing additional flexibility of processing.

In some embodiments, and as depicted in FIGS. 2 and 3, other components of the substrate support 124 discussed above can include small gaps between opposing non-sealing interfaces. For example, a small gap may be defined between the body 208 and the insulator shell 270, between the first insulator ring 230 and the second insulator ring 240, and the like.

Thus, embodiments of a substrate support 124 having reduced metal contamination have been provided herein. Covering the metal fasteners with insulating material advantageously reduces or prevents metal fasteners between conductive components of the substrate support 124 from being exposed to plasma within a processing chamber.

While the foregoing is directed to embodiments of the present disclosure, other and further embodiments of the disclosure may be devised without departing from the basic scope thereof.

The invention claimed is:

1. A substrate support, comprising:
a body;
a grounding shell formed of an electrically conductive material disposed about the body;
a liner formed of an electrically conductive material disposed about the grounding shell, wherein the liner includes an upper lip that extends inwardly towards the body;
a metal fastener disposed through the upper lip and coupling the liner to the grounding shell;
a first insulator ring disposed atop the upper lip of the liner and covering the metal fastener;
wherein at least one of:
an insulator shell is disposed between the grounding shell and the body, wherein the insulator shell electrically insulates the grounding shell from the body; or
a second insulator ring is disposed between the first insulator ring and the body; and wherein at least one of:
an outer diameter of the first insulator ring is the same as an outer diameter of the second insulator ring, or
the second insulator ring is disposed in a notched upper inside peripheral edge of the first insulator ring.

2. The substrate support of claim 1, wherein, if the outer diameter of the first insulator rind is not the same as the outer diameter of the second insulator ring, then the outer diameter of the first insulator ring is greater than the outer diameter of the second insulator ring.

3. The substrate support of claim 1, wherein a top ring is disposed on an upper surface of the second insulator ring.

4. The substrate support of claim 1, wherein the first insulator ring comprises quartz.

5. The substrate support of claim 4, wherein the second insulator ring comprises quartz.

6. The substrate support of claim 1, wherein the first insulator ring has an L-shaped cross section.

7. A substrate support, comprising:
a body;
a shaft extending downward from the body;
a grounding shell peripherally surrounding the body;
a conductive liner disposed about the body, wherein the conductive liner has an upper lip extending inwardly that overlays an upper surface of the grounding shell;
a fastener disposed through the upper lip to couple the conductive liner to the grounding shell;
a first insulator ring disposed atop the upper lip of the conductive liner and covering the fastener; and
a second insulator ring circumscribing the body, wherein the second insulator ring is disposed in a notched upper inside peripheral edge of the first insulator ring.

8. The substrate support of claim 7, wherein the fastener comprises a screw.

9. The substrate support of claim 7, wherein the first insulator ring includes a first portion and a second portion, and the second portion is disposed in a notched lower outer peripheral edge of the second insulator ring.

10. The substrate support of claim 7, wherein both the first insulator ring and the second insulator ring comprise quartz.

11. The substrate support of claim 7, wherein the first insulator ring comprises at least one of aluminum oxide, anodized aluminum, or aluminum coated with yttrium oxide.

12. The substrate support of claim 7, wherein the first insulator ring has an outer diameter greater than an outer diameter of the second insulator ring.

13. A substrate support, comprising:
a body having a cylindrical shape and a notched upper peripheral edge defined by a first surface perpendicular to a sidewall of the body;
a conductive shell having a top surface disposed about the body;
a conductive liner disposed about the conductive shell and having an inner lip that extends over the conductive shell;
a plurality of fasteners disposed through the conductive liner to couple the conductive liner to the conductive shell;
a first insulator ring disposed on a top surface of the conductive liner and covering the plurality of fasteners; and
a second insulator ring disposed between the first insulator ring and the body, wherein the second insulator ring is partially disposed within the notched upper peripheral edge of the body and extends outwardly toward the conductive liner.

14. The substrate support of claim 13, wherein the first insulator ring comprises quartz.

15. The substrate support of claim 13, wherein an outer diameter of the first insulator ring is the same as an outer diameter of the second insulator ring.

16. The substrate support of claim 13, wherein the first insulator ring and the second insulator ring have a non-linear interface therebetween.

* * * * *